(12) United States Patent
Pan et al.

(10) Patent No.: US 7,816,686 B2
(45) Date of Patent: Oct. 19, 2010

(54) FORMING SILICIDES WITH REDUCED TAILING ON SILICON GERMANIUM AND SILICON

(75) Inventors: Kuo-Hua Pan, Hsin-Chu (TW); Ken Liao, Hsin-Chu (TW); Augus Tai, Hukou Township (TW); Harry Chuang, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 548 days.

(21) Appl. No.: 11/811,694

(22) Filed: Jun. 12, 2007

(65) Prior Publication Data

US 2008/0308842 A1    Dec. 18, 2008

(51) Int. Cl.
*H01L 29/00* (2006.01)
(52) U.S. Cl. .................. 257/65; 257/288; 257/E29.104
(58) Field of Classification Search .................... 257/19, 257/18, 63, 65, 190, 192, 104, E29.193, E31.035, 257/E33.009
See application file for complete search history.

(56) References Cited

U.S. PATENT DOCUMENTS

| 7,592,214 B2 * | 9/2009 | Ohta ........................... 438/199 |
| 7,612,364 B2 * | 11/2009 | Chuang et al. ................ 257/19 |
| 2005/0184345 A1 * | 8/2005 | Lin et al. .................... 257/375 |
| 2005/0224798 A1 * | 10/2005 | Buss ........................... 257/65 |

* cited by examiner

*Primary Examiner*—Sue Purvis
*Assistant Examiner*—Leslie Pilar Cruz
(74) *Attorney, Agent, or Firm*—Slater & Matsil, L.L.P.

(57) ABSTRACT

A semiconductor structure includes a semiconductor substrate; a gate stack on the semiconductor substrate; an epitaxial region having at least a portion in the semiconductor substrate and adjacent to the gate stack, wherein the epitaxial region comprises an impurity of a first conductivity type; a first portion of the semiconductor substrate adjoining the epitaxial region, wherein the first portion of the semiconductor substrate is of the first conductivity type; and a second portion of the semiconductor substrate adjoining the first portion. The second portion of the semiconductor substrate is of a second conductivity type opposite the first conductivity type. A silicide region is formed on the epitaxial region and the first and the second portions of the semiconductor substrate.

20 Claims, 9 Drawing Sheets

US 7,816,686 B2

FORMING SILICIDES WITH REDUCED TAILING ON SILICON GERMANIUM AND SILICON

TECHNICAL FIELD

This invention relates generally to semiconductor devices, and more particularly to structures and formation methods for metal-oxide-semiconductor (MOS) devices having silicon germanium regions.

BACKGROUND

Reductions in the size of semiconductor devices (e.g., a metal-oxide semiconductor device) have enabled continued improvements in speed, performance, density, and cost per unit function of integrated circuits over the past few decades. In accordance with the design of a transistor and one of the inherent characteristics thereof, modulating the length of a channel region underlying a gate of the transistor alters a resistance associated with the channel region, thereby affecting the performance of the transistor. More specifically, shortening the length of the channel region reduces a source-to-drain resistance of the transistor, which, assuming other parameters are maintained relatively constant, may allow for an increase in current flow between the source and drain when a sufficient voltage is applied to the gate of the transistor.

To further enhance the performance of MOS devices, stress may be introduced in the channel regions of the MOS devices to improve carrier mobility. Generally, it is desirable to induce a tensile stress in the channel region of an n-type metal-oxide-semiconductor (NMOS) device in a source-to-drain direction and to induce a compressive stress in the channel region of a p-type metal-oxide-semiconductor (PMOS) device in a source-to-drain direction.

A commonly used method for applying compressive stresses to the channel regions of PMOS devices is to grow SiGe stressors in the source and drain regions. Such a method typically includes forming a gate stack on a semiconductor substrate; forming gate spacers on sidewalls of the gate stack; forming recesses in the silicon substrate; and epitaxially growing SiGe stressors in the recesses. Since SiGe has a greater lattice constant than silicon, it applies a compressive stress to the channel region, which is located between a source SiGe stressor and a drain SiGe stressor. Similarly, SiC stressors may be formed for NMOS devices. Since SiC has a smaller lattice constant than silicon, tensile stresses may be applied to the channel regions.

FIG. 1 illustrates a layout of a commonly used circuit, which includes PMOS devices 2 and 4 sharing common source 6. PMOS device 2 further includes gate poly 7 and drain region 8. PMOS device 4 further includes gate poly 9 and drain region 10. PMOS devices 2 and 4 are formed using conventional stressor formation processes, and thus common source 6 and drain regions 8 and 10 are SiGe stressors. To save the chip area, the connection to common source 6 is made through a soft connection, which includes SiGe line 12, N+ region 14 connected to SiGe line 12, and contacts 16. SiGe line 12 is formed simultaneously with the formation of common source 6 and drain regions 8 and 10. A silicide layer (not shown) is then formed on N+ region 14, SiGe line 12, common source 6 and drain regions 8 and 10.

Conventional stressor formation processes suffer drawbacks, however. FIG. 2 illustrates a cross-sectional view of the structure shown in FIG. 1, wherein the cross-sectional view is taken along line A-A' in FIG. 1. Silicide layer 18 is formed across common source 6, SiGe line 12, and N+ regions 14. It has been found that in region 19, which is an interface region between SiGe line 12 and N+ region 14, the thickness of silicide layer 18 is significantly less than in other regions. This may be related to the fact that metals tend to form silicide with silicon better than germanium.

The reduction in thickness of silicide layer 18 in region 19 causes sheet resistance tailing. Ideally, if multiple samples with the structure shown in FIGS. 1 and 2 are measured, the sheet resistances of the samples, without tailing effect, should be within a relatively small range. If tailing effects occur, however, an increased percentage of the samples will have higher sheet resistances. It has been found that sheet resistances are directly related to the RC delays of the integrated circuits. The tailing effects will cause the increase in RC delay, and possibly function failure of the integrated circuits. A solution is thus needed.

SUMMARY OF THE INVENTION

In accordance with one aspect of the present invention, a semiconductor structure includes a semiconductor substrate; a gate stack on the semiconductor substrate; an epitaxial region having at least a portion in the semiconductor substrate and adjacent to the gate stack, wherein the epitaxial region comprises an impurity of a first conductivity type; a first portion of the semiconductor substrate adjoining the epitaxial region, wherein the first portion of the semiconductor substrate is of the first conductivity type; a second portion of the semiconductor substrate adjoining the first portion, wherein the second portion of the semiconductor substrate is of a second conductivity type opposite the first conductivity type; and a silicide region on the epitaxial region and the first and the second portions of the semiconductor substrate.

In accordance with yet another aspect of the present invention, a semiconductor structure includes a semiconductor substrate; a gate over the semiconductor substrate; and a silicon germanium (SiGe) region in the semiconductor substrate. The SiGe region comprises a first portion adjacent the gate and a second portion adjoining the first portion. The second portion has a width substantially smaller than a width of the first portion. The semiconductor structure further includes a heavily doped p-type region adjoining the second portion of the SiGe region, wherein the heavily doped p-type region has a substantially same width as the second portion of the SiGe region; and a pickup region adjoining the heavily doped p-type region, wherein the pickup region is of n-type.

In accordance with yet another aspect of the present invention, a semiconductor structure includes a semiconductor substrate; a first p-type metal-oxide-semiconductor (PMOS) device comprising a first gate polysilicon on the semiconductor substrate; a second PMOS device comprising a second gate polysilicon on the semiconductor substrate, wherein the first the second gate polysilicons are parallel; a SiGe region between and adjacent the first and the second gate polysilicons, the SiGe region having a first width; a SiGe extension adjoining the SiGe region; a P+ region adjoining the SiGe extension; an N+ extension region adjoining the P+ region, wherein the SiGe extension, the P+ region, and the N+ region have a same second width smaller than the first width; and a pickup region adjoining the N+ extension region, wherein the pickup region is an N+ region.

By inserting a P+ region between an N+ region and SiGe region, the tailing effects of the sheet resistance is reduced.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
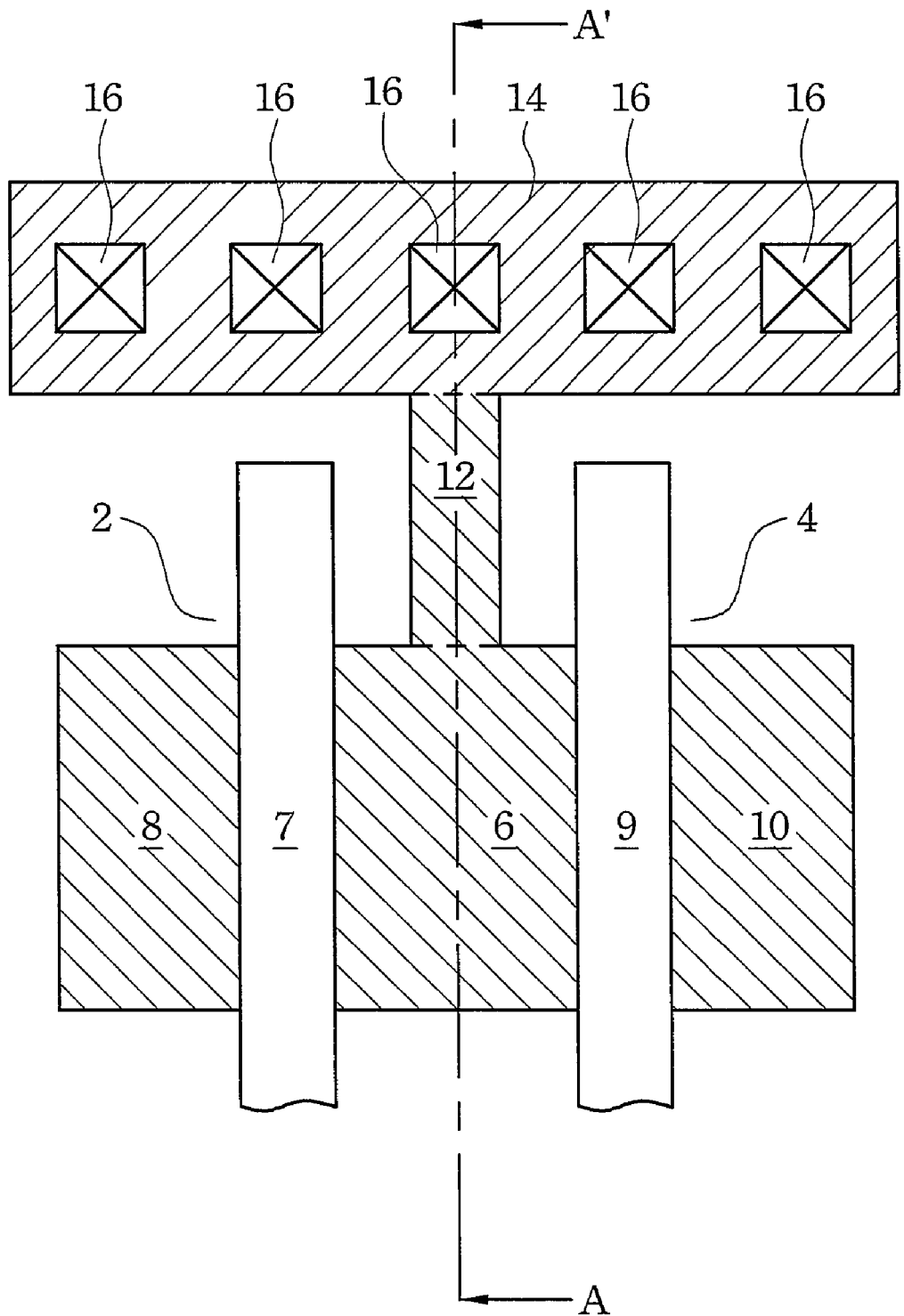
FIG. 1 illustrates a layout of a conventional semiconductor structure, wherein a soft connection is made to electrically connect a pickup region and a SiGe region.
Figure 2:
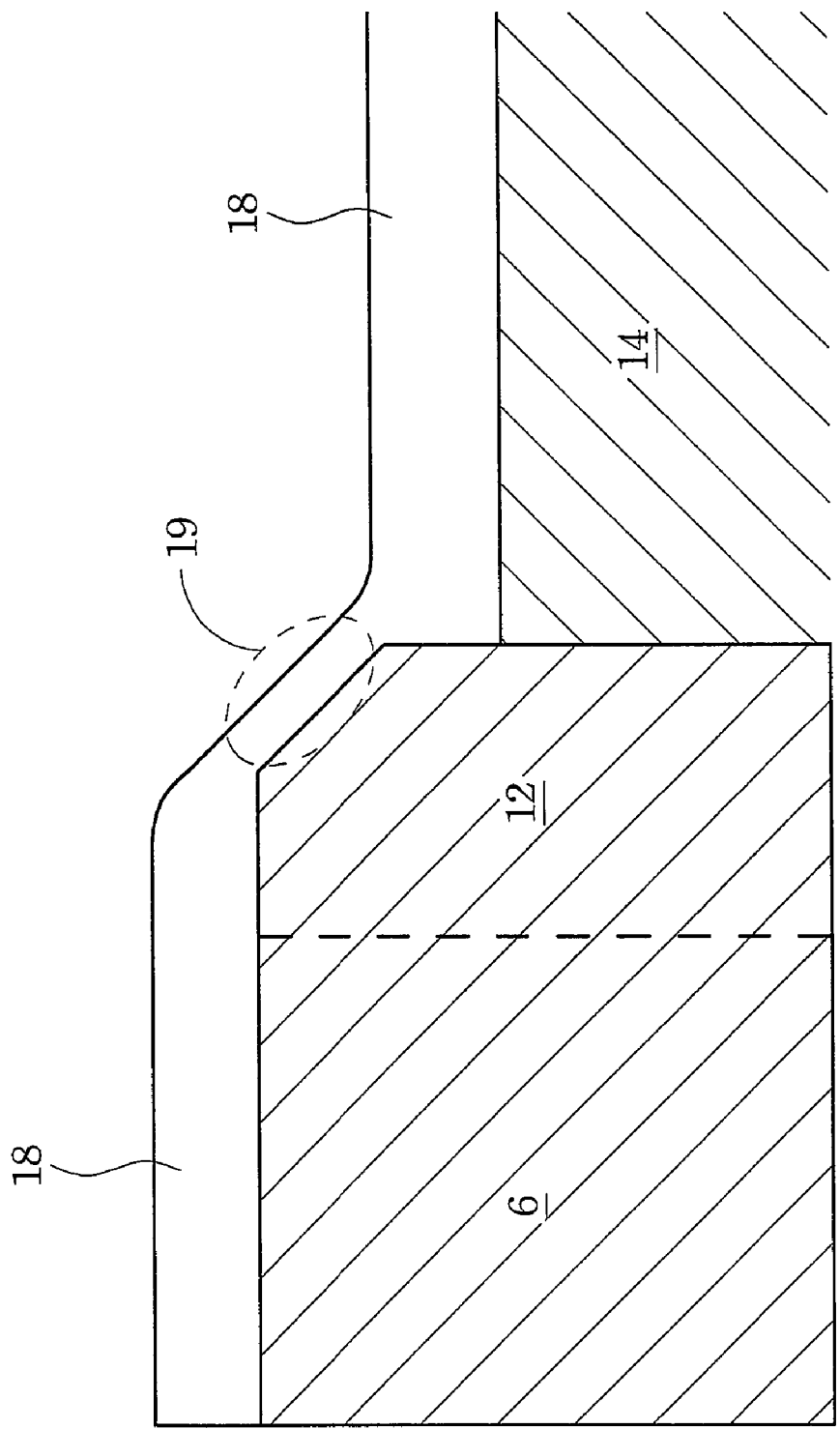
FIG. 2 illustrates a cross-sectional view of the structure shown in FIG. 1.
Figure 3:
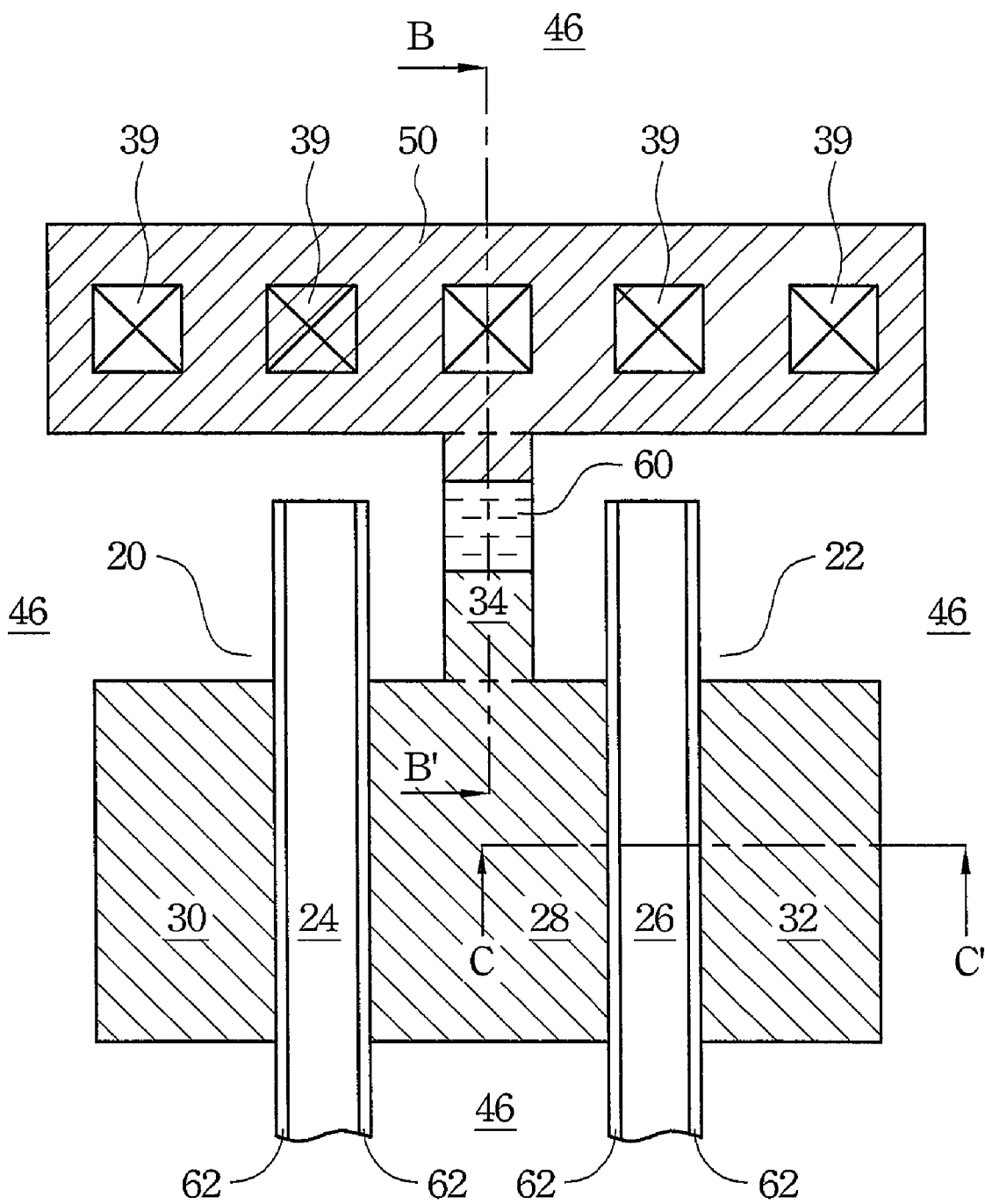
FIG. 3 illustrates a layout of an embodiment of the present invention, wherein a P+ region is inserted between an N+ pickup region and a SiGe region.

FIG. 3 illustrates a layout of an embodiment of the present invention. PMOS device 20 includes drain region 30, common source region 28 and gate electrode 24, which may be formed of polysilicon. Throughout the description, gate electrodes of the MOS devices are equally referred to as gate polys, although they can be formed of other conductive materials such as metals, metal suicides, and combinations thereof. PMOS device 22 includes common source region 28, drain region 32 and gate poly 26. Gate spacers 62 are formed on sidewalls of gate polys 24 and 26. Drain regions 30, 32 and common source 28 are formed of silicon germanium (SiGe). Common source 28 is also referred to as SiGe region 28.

The connection to common source region 28 is made through a soft connection, which includes an N+ pickup region 50. A narrow doped region, including doped SiGe region 34 and P+ region 60, connects N+ pickup region 50 and common source region 28. Regions 28, 30, 32, 34, 50 and 60 preferably have a silicide layer (not shown) formed thereon to improve the contact. Contacts 39 are formed to electrically connect the silicide layer to a metallization layer (not shown). In various embodiments, an interface between P+ region 60 and region 34 is parallel to the gate length directions (which are parallel to the source-to-drain directions) of PMOS devices 20 and 22. Further, an interface between P+ region 60 and N+ pickup region 50 is parallel to the gate length directions of PMOS devices 20 and 22.

Figure 4:
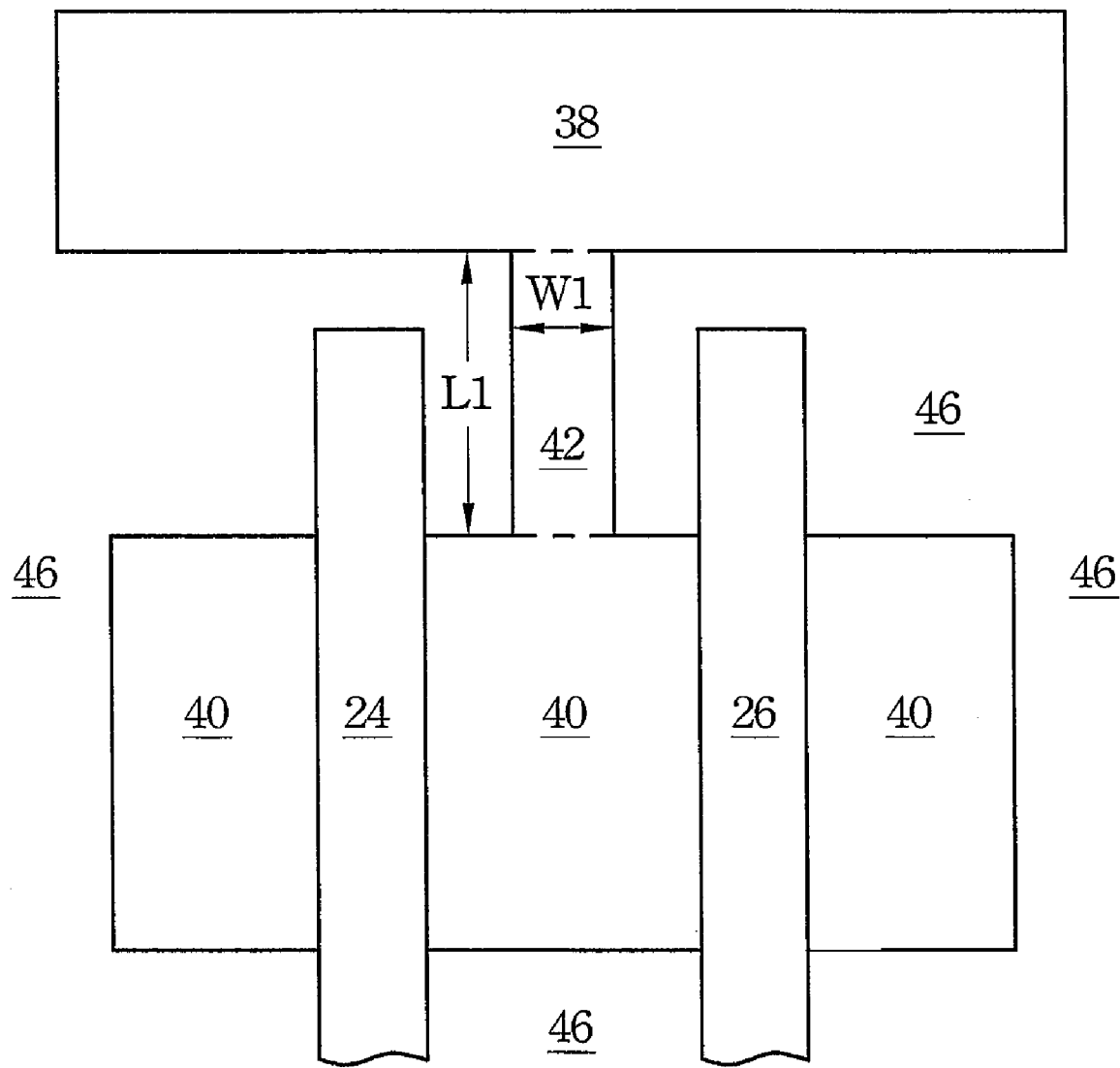
FIGS. 4 through 8 illustrate intermediate stages in the formation of the embodiment shown in FIG. 3.

FIGS. 4 through 8 illustrate intermediate stages in the formation of the structure shown in FIG. 3. FIG. 4 illustrates a top view of a starting structure. Insulating regions 46 are formed in a semiconductor substrate, defining active regions 38, 40 and 42 of the semiconductor substrate. Exemplary insulating regions 46 include shallow trench isolation (STI) regions. Active regions 38, 40 and 42 form a continuous region. Active region 42 is substantially narrower than active regions 38 and 40. In an exemplary embodiment, active region 42 has a width W1 of less than about 0.3 µm, and more preferably less than about 0.1 µm, and even more preferably less than about 0.08 µm. Length L1 of active region 42 is preferably less than about 0.25 µm, and more preferably between about 0.1 µm and about 0.2 µm.

Gate polys 24 and 26 are formed over active region 40. As is known in the art, gate dielectric layers (not shown) are formed between gate polys 24 and 26 and the underlying active region 40. The formation processes of gate polys 24 and 26 and the gate dielectric layers are well known in the art, and thus are not repeated herein.

Figure 5:
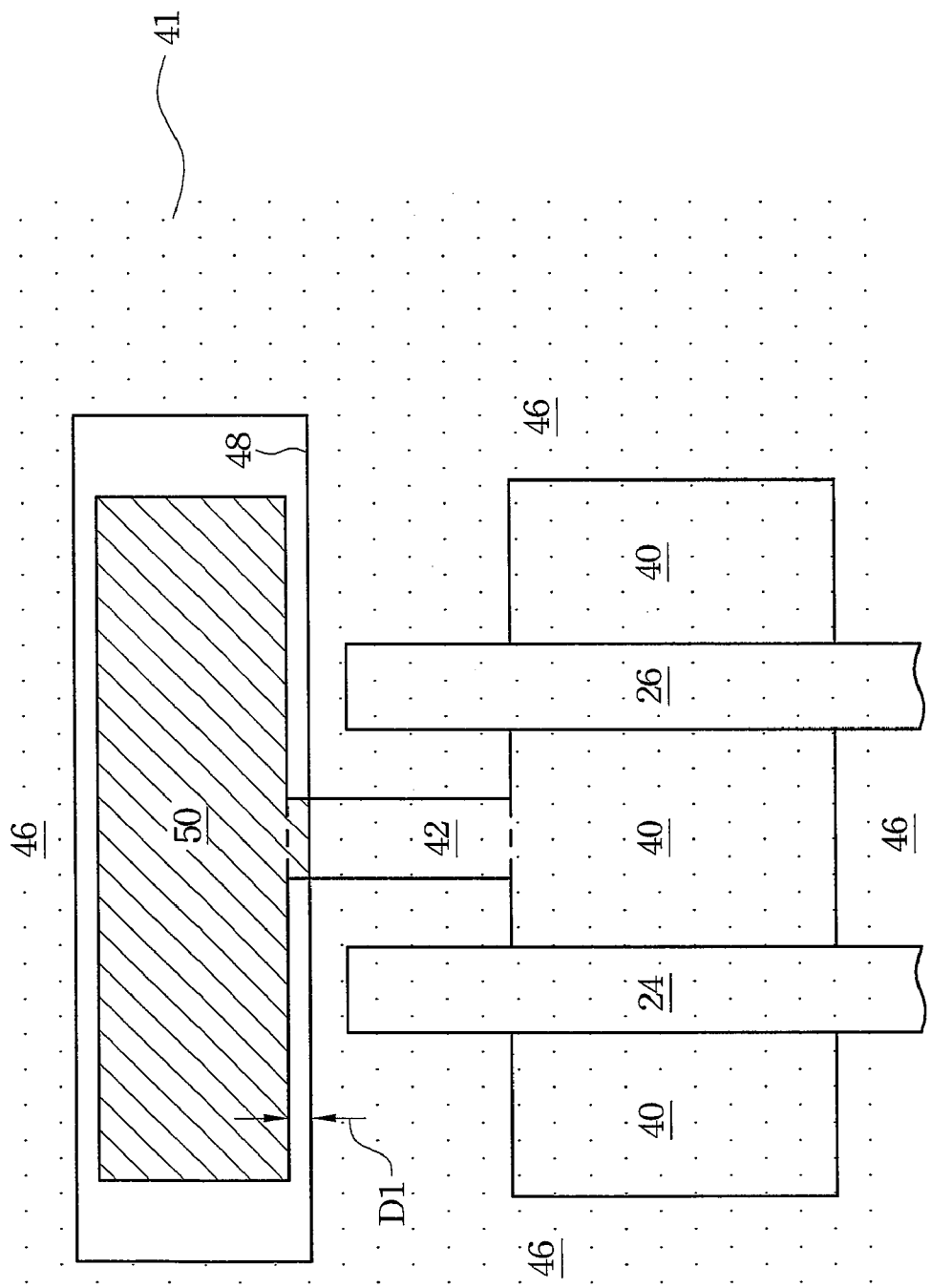

Referring to FIG. 5, active region 38 is doped by implanting n-type impurities, such as phosphorous, arsenic, and combinations thereof. As a result, N+ pickup region 50 is formed. In the formation of N+ pickup region 50, N-mask 41 (shown as shaded with dots), is formed to cover entire active region 40 and at least a portion of active region 42, but leaves active region 38 and some surrounding insulating regions 46 exposed to the implantation. Preferably, the exposed region has a rectangular shape. N-mask 41 may include photoresist, silicon nitride, or other commonly used mask materials. In an exemplary embodiment, pickup region 50 has an impurity concentration of greater than about $1E20/cm^3$. Preferably, pickup region 50 extends slightly into active region 42, for example, for a distance D1 of less than about 0.05 µm.

Figure 6:
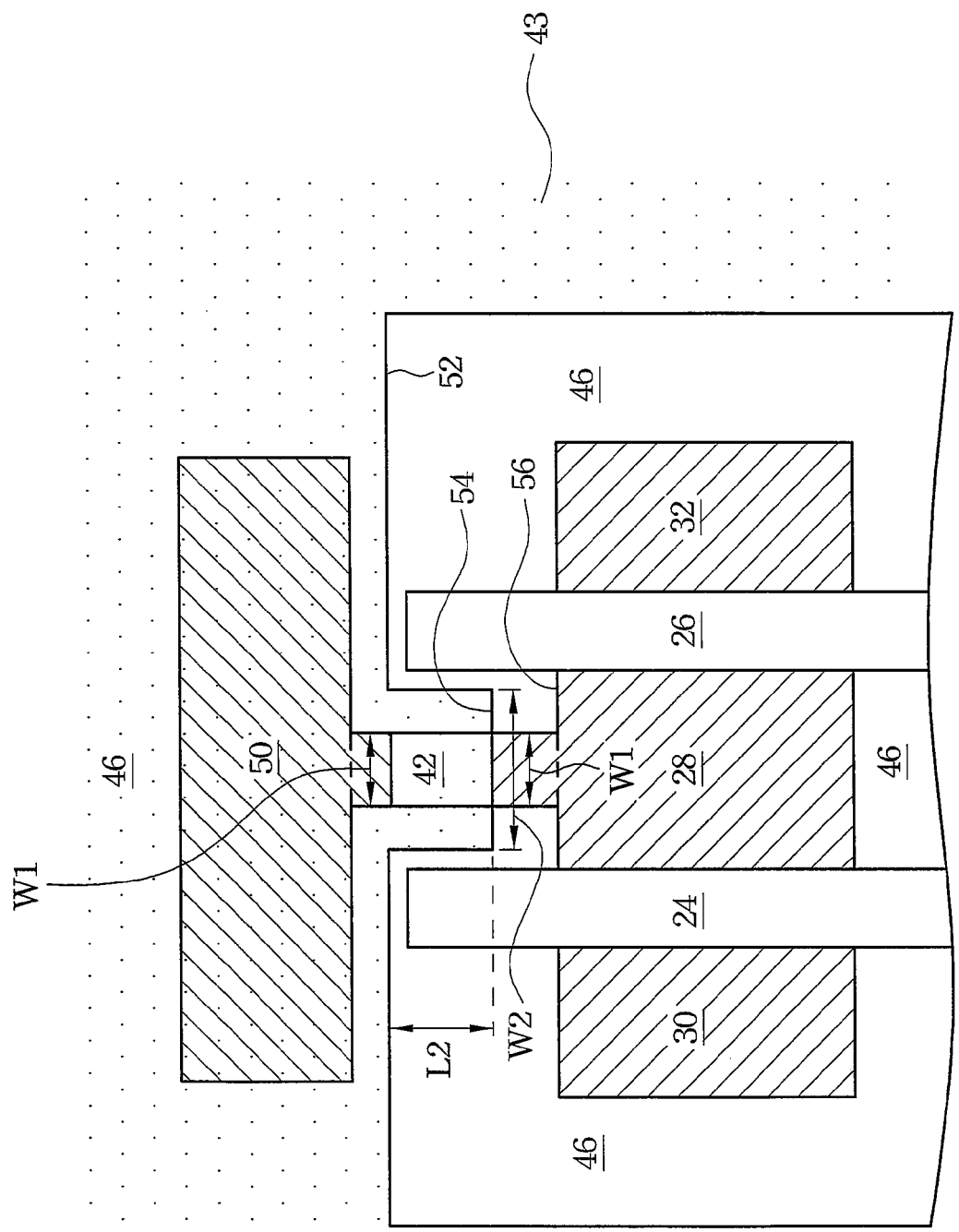

FIG. 6 illustrates the formation of silicon germanium (SiGe) regions. P-mask 43, which covers dotted regions but leaves the un-dotted region open, is formed. In the preferred embodiment, P-mask 43 leaves a rectangular region, except that an extended portion of P-mask 43 extends into the rectangular region. Preferably, P-mask 43 has a boundary 52 substantially overlapping boundary 48 of N-mask 41 (refer to FIG. 5). The extended portion of the P-mask 43 preferably has length L2 of more than about 0.06 µm. Width W2 of the extended portion of P-mask 43 is preferably greater than width W1 of active region 42. More preferably, on each side of active region 42, the extended portion of the P-mask 43 extends beyond active region 42 for more than about 0.08 µm as a margin. Boundary 54 of the extended portion of P-mask 43 is preferably spaced apart from boundary 56 of the original active region 40, for example, for more than about 0.08 µm. This is to prevent the occurrence of the case that the extended portion of P-mask 43 is spaced apart from the nearest boundary of active region 40 with a very small distance. In this case, there is a chance that the portion of active region 42 between boundaries 54 and 56 will not be fully filled with SiGe in the subsequent process steps.

In the preferred embodiment, P-mask 43 is formed by applying logic operations (LOP) to a conventional mask that does not have the extended portion. Through LOP, the boundary of the P-mask may be revised as required.

SiGe regions are then formed using P-mask 43. As is known in the art, recesses are first formed in exposed active regions 40 and 42 (refer to FIG. 5). A semiconductor material, preferably SiGe, is epitaxially grown in the recesses by selective epitaxial growth (SEG), forming common source 28 and drain regions 30 and 32.

Figure 7A:
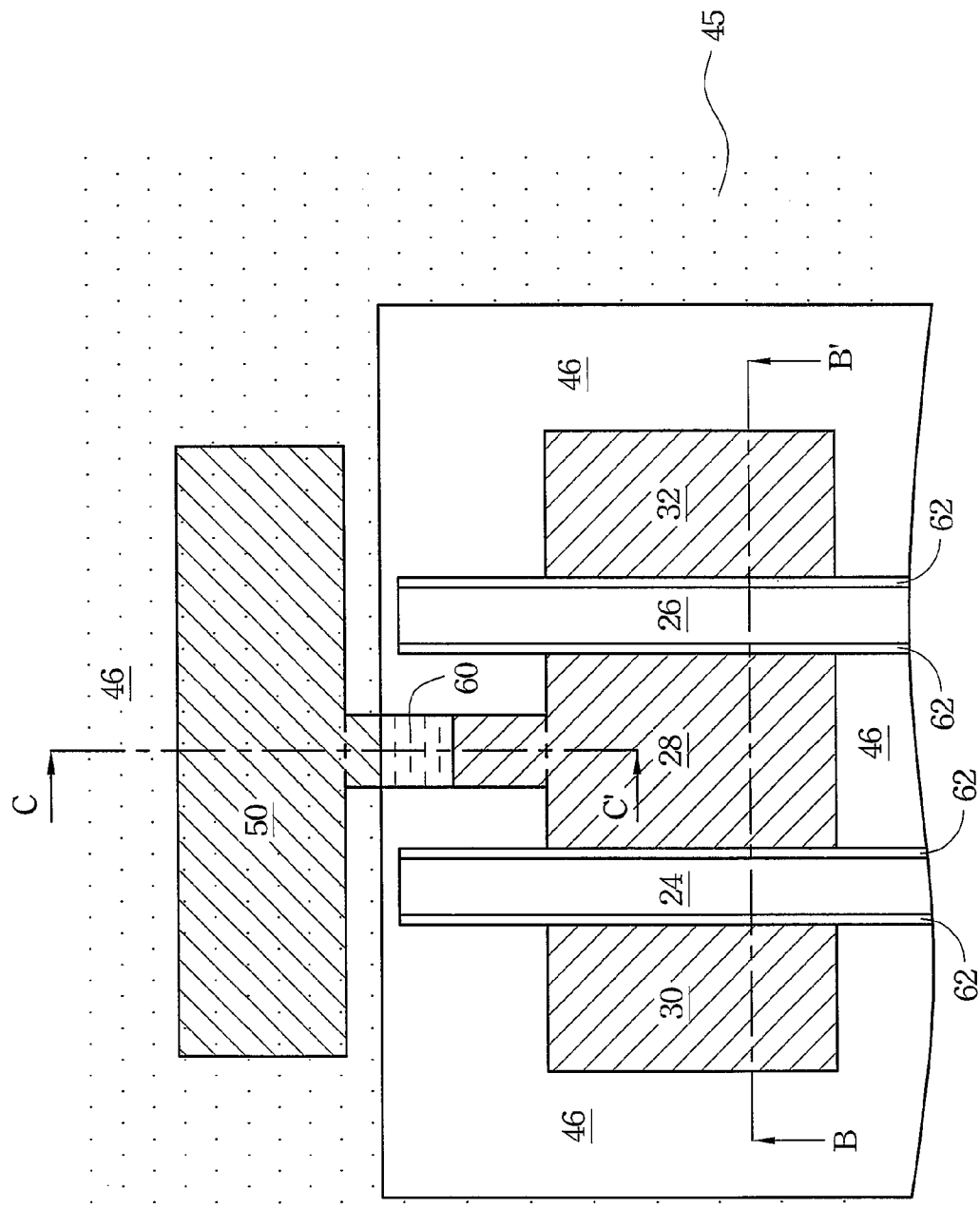

In subsequent process steps, as shown in FIG. 7A, P-mask 43 is removed, and gate spacers 62 are formed. Mask 45 (shown with dotted pattern) may be formed to cover a rectangular region, which is substantially similar to P-mask 43, except the extended portion is not being removed. A p-type implantation is then performed. Accordingly, SiGe regions 28, 30 and 32 are implanted with p-type impurities. Region 60, which is between N+ pickup region 50 and common source region 28, forms a P+ region. Preferably, P+ region 60 has a p-type impurity concentration of greater than about 1 E20/cm³.

Figure 7B:
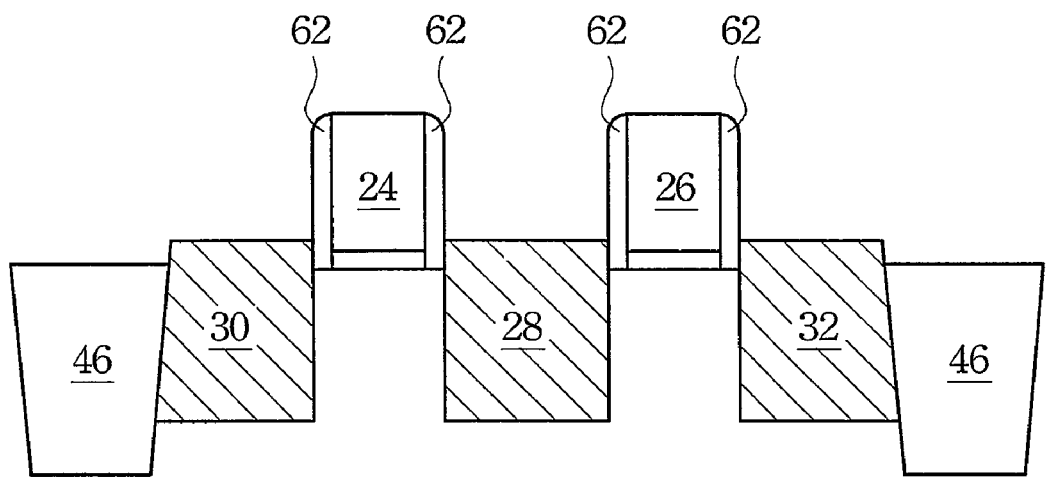
Figure 7C:
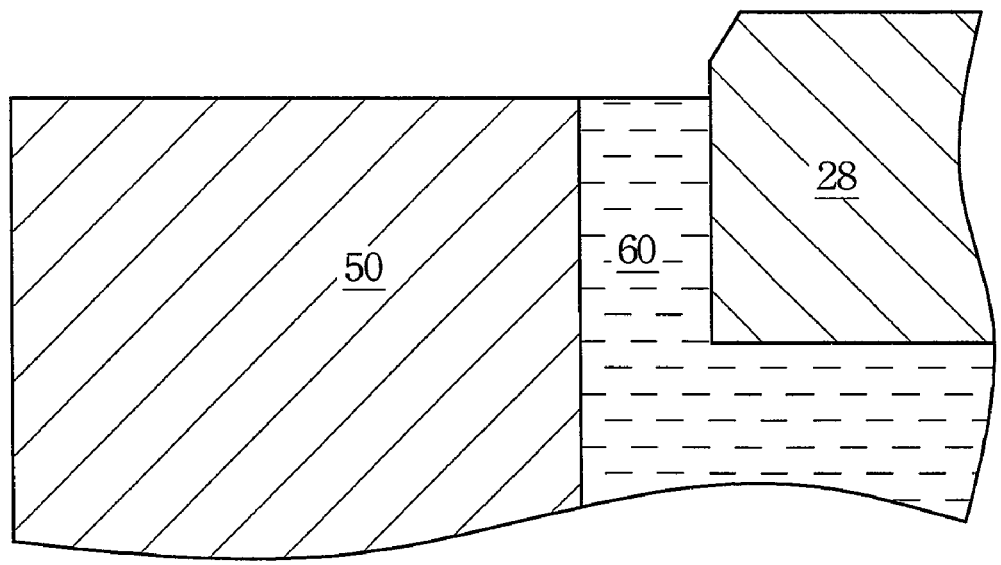

FIG. 7B illustrates a cross-sectional view of the structure shown in FIG. 7A, wherein the cross-sectional view is taken along a plane crossing line B-B'. FIG. 7C illustrates a cross-sectional view taken along a plane crossing line C-C'. Preferably, SiGe regions 28, 30 and 32 have a top surface higher than the top surfaces of P+ region 60 and N+ pickup region 50.

Figure 8:
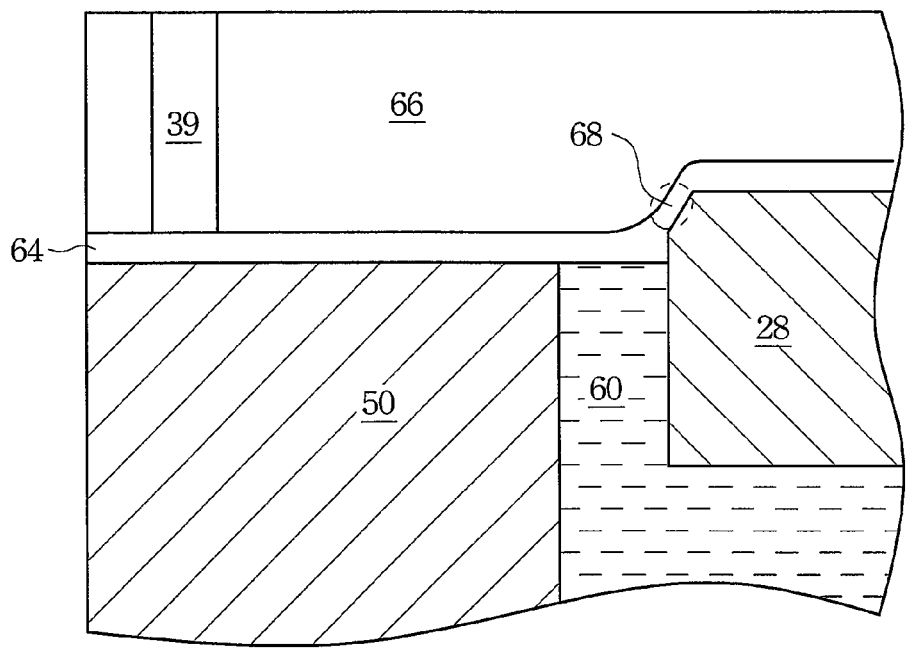

FIG. 8 illustrates the formation of silicide layer 64, interlayer dielectric (ILD) 66 and contact 39, wherein FIG. 8 is a cross-sectional view taken along the plane crossing line C-C' in FIG. 7A. As is known in the art, silicide layer 64 may be formed by blanket forming a metal layer (not shown), annealing the wafer to cause a reaction between the metal layer and the underlying silicon or SiGe, and removing un-reacted metal layer so that silicide and/or germano-silicide remains. In subsequent steps, ILD 66 is formed, followed by the formation of contact 39 in ILD 66. Contact 39 connects an overlying metallization layer (not shown) to silicide layer 64, which is further connected to common source 28.

When a current flows between contact 39 and common source 28, the current tends to take a path with the least resistivity, which is silicide layer 64. Typically, silicide region 68, which is close to the boundary (sidewall) of SiGe region 28, tends to have a lesser thickness than other portions. As a result, a sheet resistance of silicide region 68 is greater than other portions of silicide layer 64, causing tailing effects. Advantageously, since P+ region 60 and SiGe region 28 are of a same conductivity type, the current may also flow through P+ regions 60 and SiGe region 28 in addition to silicide region 68. The sheet resistance is thus reduced. Accordingly, the tailing effects are significantly reduced, and possibly substantially eliminated. As a comparison, in a conventional structure including no inserted P+ region 60, N+ region 50 will adjoin and form an n-p junction with SiGe region 28, preventing the current from flowing from SiGe region 28. Accordingly, tailing effects occur.

Figure 9:
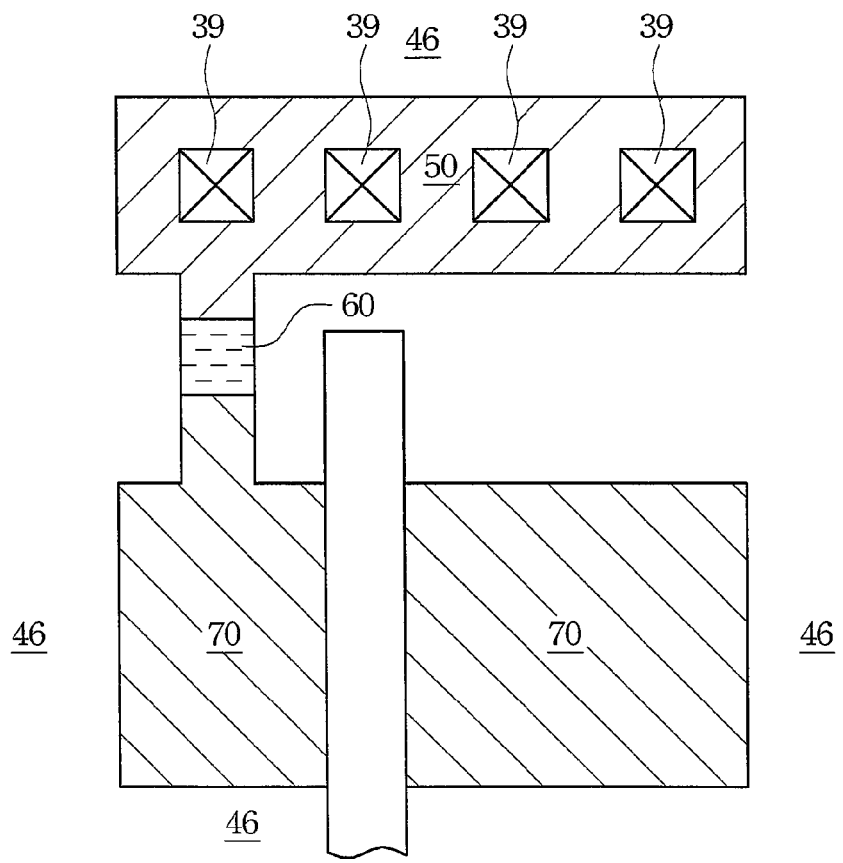
FIG. 9 illustrates an alternative embodiment of the present invention.

FIG. 9 illustrates an alternative embodiment of the present invention, wherein a source/drain region of the PMOS device adjoins STI region 46 instead of another PMOS device. Again, pickup region 50 is formed, and is connected to the source/drain region 70 through P+ region 60. The formation and dimensions of pickup region 50 and P+ region 60 may be essentially the same as in the embodiment shown in FIGS. 3 through 8.

The concept of the preferred embodiments of the present invention may be used for the formation of NMOS devices, which includes SiC stressors for applying tensile stresses to the respective channel regions of the MOS devices. The structures are similar to those illustrated in FIGS. 3 and 9, except that the types of the discussed regions are inverted and SiGe regions are replaced by SiC regions. Preferably, an N+ inserted region is formed to adjoin the SiC stressor and a P+ pickup region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a semiconductor substrate;
    a gate stack of an MOS device on the semiconductor substrate;
    an epitaxial region having at least a portion in the semiconductor substrate and adjacent to the gate stack, wherein the epitaxial region comprises an impurity of a first conductivity type;
    a first portion of the semiconductor substrate adjoining the epitaxial region, wherein the first portion of the semiconductor substrate is of the first conductivity type, and wherein the epitaxial region and the first portion of the semiconductor substrate have an interface extending in a direction parallel to a gate length direction of the MOS device;
    a second portion of the semiconductor substrate adjoining the first portion, wherein the second portion of the semiconductor substrate is of a second conductivity type opposite the first conductivity type; and
    a silicide region on the epitaxial region and the first and the second portions of the semiconductor substrate.

2. The semiconductor structure of claim 1, wherein the epitaxial region comprises silicon germanium, and wherein the first portion is of p-type, and the second portion is of n-type.

3. The semiconductor structure of claim 1, wherein the first portion is of n-type, and the second portion is of p-type.

4. The semiconductor structure of claim 1 further comprising a contact connected to a portion of the silicide region directly on the second portion of the semiconductor substrate.

5. The semiconductor structure of claim 1, wherein the first portion of the semiconductor substrate is farther away from the gate stack than the epitaxial region.

6. The semiconductor structure of claim 1, wherein the MOS device is a first PMOS device, and wherein the second portion of the semiconductor substrate is a pickup region with a contact formed directly over the pickup region.

7. The semiconductor structure of claim 6 further comprising a second PMOS device sharing the epitaxial region as a common source region with the first PMOS device, wherein the gate length direction of the first PMOS device is parallel to a gate length direction of the second PMOS device.

8. The semiconductor structure of claim 1, wherein the first portion of the semiconductor substrate has a width smaller than a width of the epitaxial region and a width of the second portion of the semiconductor substrate, with the width of the first portion, the width of the epitaxial region, and the width of the second portion being measured in directions parallel to the gate length direction of the MOS device.

9. The semiconductor structure of claim 8, wherein the width of the first portion of the semiconductor substrate is less than about 0.1 μm.

10. The semiconductor structure of claim 8, wherein each of the second portion of the semiconductor substrate and the epitaxial region further comprises an additional portion adjoining the first portion of semiconductor substrate, and having a width substantially equal to the width of the first portion of the semiconductor substrate, and wherein the width of the additional portion of the second portion and the additional portion of the epitaxy region are measured in a direction parallel to the gate length direction of the MOS device.

11. A semiconductor structure comprising:
   a semiconductor substrate;
   a gate over the semiconductor substrate;
   a silicon germanium (SiGe) region in the semiconductor substrate, wherein the SiGe region comprises a first portion adjacent the gate and a second portion adjoining the first portion, and wherein the second portion has a width substantially smaller than a width of the first portion;
   a heavily doped p-type region adjoining the second portion of the SiGe region, wherein the heavily doped p-type region has a substantially same width as the second portion of the SiGe region; and
   a pickup region adjoining the heavily doped p-type region, wherein the pickup region is of n-type, and comprises an extension adjoining the heavily doped p-type region, and wherein the extension of the pickup region and the second portion of the SiGe region have a substantially same width.

12. The semiconductor structure of claim 11 further comprising a silicide region on the SiGe region, the heavily doped p-type region and the pickup region.

13. The semiconductor structure of claim 11, wherein the second portion of the SiGe region has a length of greater than about 0.1 μm.

14. The semiconductor structure of claim 11, wherein the second portion of the SiGe region has a width of less than about 0.08 μm.

15. The semiconductor structure of claim 11 further comprising a shallow trench isolation region on an opposite side of the first portion of the SiGe region than the gate, wherein the shallow trench isolation region contacts the first portion of the SiGe region.

16. The semiconductor structure of claim 11 further comprising an additional gate over the semiconductor substrate, wherein the additional gate is on an opposite side of the first portion of the SiGe region than the gate.

17. The semiconductor structure of claim 11, wherein the gate is a portion of a PMOS device, and wherein an interface between the extension of the pickup region and the heavily doped p-type region is parallel to a gate length direction of the PMOS device.

18. A semiconductor structure comprising:
   a semiconductor substrate;
   a first p-type metal-oxide-semiconductor (PMOS) device comprising a first gate polysilicon on the semiconductor substrate;
   a second PMOS device comprising a second gate polysilicon on the semiconductor substrate, wherein the first and the second gate polysilicons are parallel to a first direction;
   a SiGe region between and adjacent the first and the second gate polysilicons, the SiGe region having a first width measured in a second direction perpendicular to the first direction;
   a SiGe extension adjoining the SiGe region;
   a P+ region adjoining the SiGe extension, wherein the P+ region and the SiGe extension have a first interface substantially parallel to the second direction;
   an N+ extension region adjoining the P+ region, wherein the SiGe extension, the P+ region, and the N+ extension region have a same second width smaller than the first width and measured in a direction parallel to the second direction; and
   a pickup region adjoining the N+ extension region, wherein the pickup region is an N+ region.

19. The semiconductor structure of claim 18 further comprising:
   a silicide region on the SiGe extension, the P+ region, the N+ extension region, and the pickup region;
   a contact physically contacting the silicide region, wherein the contact is directly over the pickup region.

20. The semiconductor structure of claim 18, wherein the P+ region and the N+ extension region have a second interface substantially parallel to the second direction.

* * * * *